United States Patent [19]
Murakami

[11] Patent Number: 5,604,500
[45] Date of Patent: Feb. 18, 1997

[54] A/D CONVERSION PROCESS

[75] Inventor: Kenji Murakami, Kariya, Japan

[73] Assignee: Nippondenso Co., Ltd., Kariya, Japan

[21] Appl. No.: 255,779

[22] Filed: Jun. 8, 1994

[30] Foreign Application Priority Data

Jun. 10, 1993 [JP] Japan .................... 5-138796
[51] Int. Cl.⁶ .................................. H03M 1/06
[52] U.S. Cl. .................... 341/118; 341/141; 341/155; 123/417
[58] Field of Search .................. 341/118, 141, 341/155; 123/416–417

[56] References Cited

U.S. PATENT DOCUMENTS 4,264,898  4/1981  Barman et al. .............. 340/347 NT
5,025,259  6/1991  Abe ............................. 341/118

FOREIGN PATENT DOCUMENTS 52653  1/1993  Japan.

*Primary Examiner*—Jeffrey A. Gaffin
*Assistant Examiner*—Jason L. W. Kost
*Attorney, Agent, or Firm*—Cushman Darby & Cushman IP Group of Pillsbury Madison & Sutro, LLP

[57] ABSTRACT

In a control circuit including an A/D converter, a parallel-to-serial input buffer, a parallel input buffer, a serial-to-parallel output buffer and a parallel output buffer which are built in a chip, provided with a microcomputer, an A/D conversion is carried out by controlling a time of an A/D conversion conducted by the A/D converter correspondingly to a condition of an output port of the output buffer, thereby preventing an A/D converted value from being affected by an inversion in the output of the buffer.

32 Claims, 6 Drawing Sheets

A/D CONVERSION PROCESS

BACKGROUND OF THE INVENTION

1. Field of the Invention

The present invention relates to an A/D conversion process.

2. Description of Prior Art

There has recently been developed a highly integrated circuit in which at least an A/D converter and an input-output buffer are built in a single chip.

Such a highly integrated circuit has a disadvantage that an ON/OFF inversion in an output port controlling a large current sometimes affects a value converted by the A/D converter to cause an error in the converted value. More specifically, in a highly integrated circuit used in an engine control unit controlling the engine, if an A/D converter has a dynamic range from 0 to 5 V and outputs a 10-bit digital signal in response to an inputted analog signal, the A/D converter carries out an A/D conversion with a resolution of approximately 5 mV. An output buffer is, on the other hand, connected with a base terminal of a transistor which serves to drive an injector to control an electric current of a several amperes, therefore being drivable by a current of 50 to 100 mA as a base current. In consequence, an inversion, for example a change in an ON/OFF state in an output port of the output buffer, may affect a value converted by the A/D converter, leading to an error in the converted value.

SUMMARY OF THE INVENTION

An object of this invention is to provide a process to accurately carry out an A/D conversion without being affected by a change in the output of the output buffer.

According to a first aspect of this invention, there is provided an A/D conversion process in a control circuit in which at least an A/D converter and an output buffer are built in a chip comprising the step of controlling a time of an A/D conversion conducted by said A/D converter correspondingly to a condition in an output of said output buffer.

The time of the A/D conversion by the A/D converter is controlled corresponding to an output condition of the output buffer. As a result, it is possible to avoid occurrence of an error in a converted value yielded by the A/D converter caused by a change in the output of the output buffer.

According to a second aspect of this invention, there is provided an A/D conversion process in a control circuit in which at least an A/D converter and an output buffer are built in a chip comprising the steps of discriminating an inversion in an output of said output buffer, and carrying out an A/D conversion once more if said A/D converter carried out an A/D conversion when said inversion in the output of the output buffer occurred.

An inversion in the output of the output buffer is detected. If the A/D conversion is carried out when the inversion occurs in the output of the output buffer, the A/D conversion is again carried out.

According to a third aspect of this invention, there is provided an A/D conversion process in a control circuit in which at least an A/D converter and an output buffer are built in a chip comprising the step of compulsorily staggering a time of an inversion in an output of said output buffer and a time of an A/D conversion by said A/D converter.

By compulsorily staggering the time of an inversion and the time of the A/D conversion, it is possible to prevent an A/D converted value from being affected by the inversion.

As above, this invention performs is effective to an accurate A/D conversion without being affected by a changed in the output of the output buffer.

BRIEF DESCRIPTION OF THE DRAWINGS

The foregoing and other objects, features and advantages of the invention will be apparent from the following description of embodiments of the invention with reference to the corresponding accompanying drawings in which.

DESCRIPTION OF PREFERRED EMBODIMENTS

Figure 1:
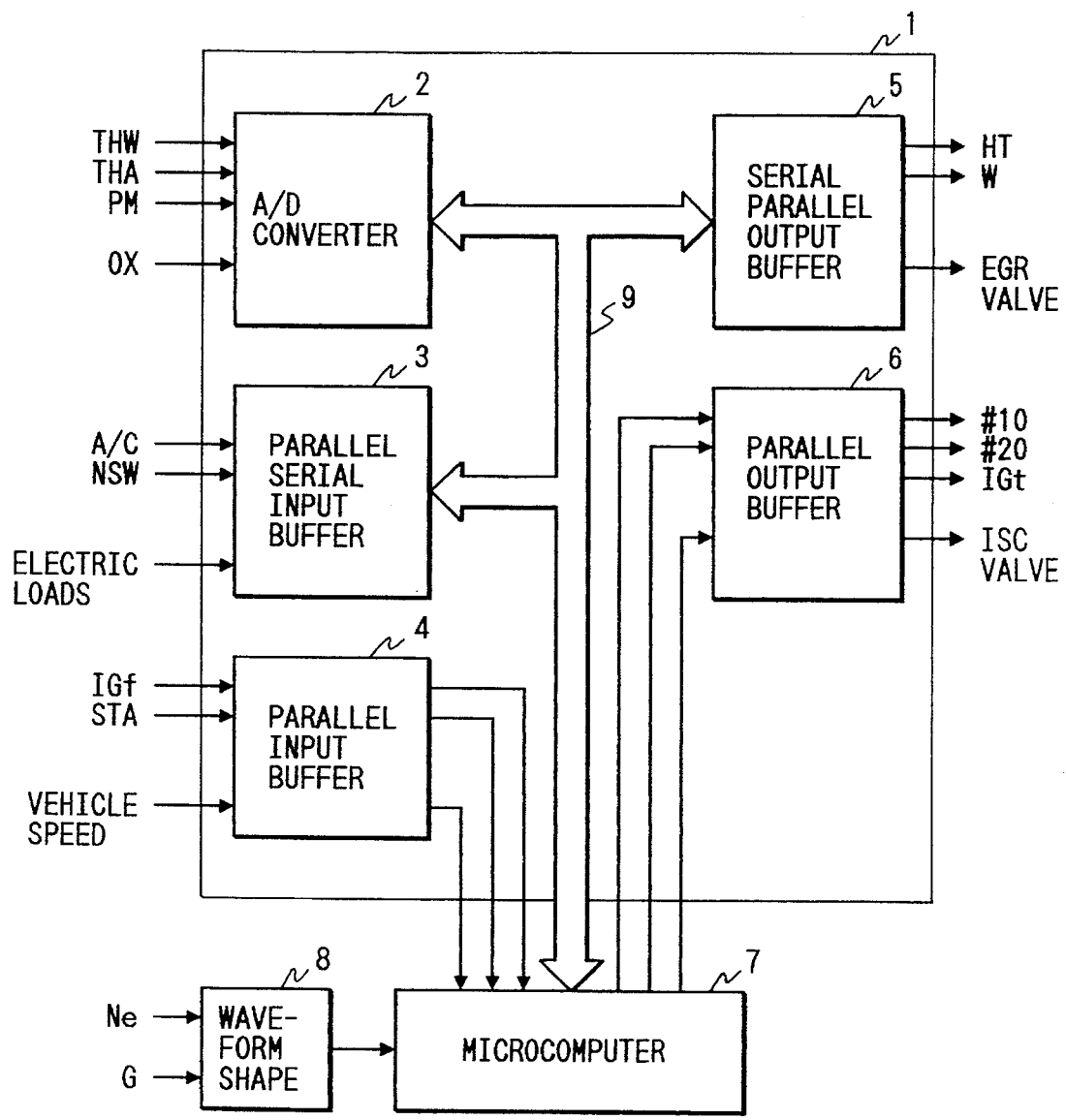
FIG. 1 is a schematic diagram of a control circuit of this invention.

Description will be now made of an A/D conversion process according to a first embodiment of this invention referring to the drawings.

FIG. 1 is a block diagram of an electronic control circuit for a gasoline engine of a spark ignition type equipped in a motor vehicle. This control circuit is a highly-integrated circuit, that is, a lot of ICs used in an engine control unit (ECU) are built together into a single chip.

In a chip 1, an A/D converter 2, a parallel-to-serial input buffer 3, a parallel input buffer 4, a serial-to-parallel output buffer 5 and a parallel output buffer 6 are built. The A/D converter 2 is a high-accuracy converter, which has a dynamic range from 0 to 5 V and outputs a digital signal of 10 bits in response to an analog input signal. More specifically, the A/D converter 2 converts the inputted analog signal into a digital signal with a resolution of 5 mV. The A/D converter 2 is supplied various sensor signals representing a condition of the engine. In practice, the A/D converter 2 receives a coolant temperature signal THW from an engine coolant temperature sensor which detects a temperature of an engine coolant, an intake air temperature signal THA from an intake air temperature sensor which detects a temperature of air taken into the engine, an intake air pressure signal PM from an intake air pressure sensor which detects a pressure of air in an inlet pipe located downstream from an engine throttle valve, an $O_2$ sensor signal from an $O_2$ sensor which detects a quantity of oxygen contained in exhausted air from the engine, etc. These analog signals obtained by the above sensors are converted into digital signals by the A/D converter 2.

The parallel-to-serial output buffer 3 is supplied with non-high-speed signals such as an ON/OFF signal A/C from an air conditioner switch, a signal NSW from a neutral safety switch, electric loads of a defogger, head lamps and the like.

The parallel input buffer 4 is supplied with various switch signals including a high-speed input signal, such as an ignition fail signal IGf, a starter signal STA, a vehicle speed signal and the like.

The serial-to-parallel output buffer 5 outputs non-high-speed signals, such as a driving signal HT to an $O_2$ sensor heater and another driving signal W to a diagnostic warning lamp. The serial-to-parallel output buffer also outputs a driving signal to an exhaust gas recirculation (EGR) valve.

An $O_2$ sensor heater driving signal HT output port of the serial-to-parallel output buffer 5 is connected with a base terminal of a transistor which serves to drive the $O_2$ sensor heater. The $O_2$ sensor heater driving transistor is controlled to be ON or OFF in response to the $O_2$ sensor heater driving signal HT, thereby conductively controlling the $O_2$ sensor heater.

The parallel output buffer 6 mainly outputs high-speed signals such as driving signals (#10, #20) for respective fuel injector valves, along with an ignition signal IGt. The parallel output buffer 6 also outputs a driving signal for an idle speed control (ISC) valve.

Injector driving signal output ports of the parallel output buffer 6 are connected with base terminals of respective transistors which serve to drive injectors. Each of the injector driving transistors is controlled to be ON or OFF in response to the injector driving signal, thereby controlling an open and close of a valve of the injector.

The control circuit is provided with a microcomputer 7. The microcomputer 7, the A/D converter 2, the parallel-to-serial input buffer 3 and the serial-to-parallel output buffer 5 are mutually connected through a serial communication line 9. The parallel input buffer 4 and the parallel output buffer 6 are connected in parallel with the microcomputer 7.

Via the A/D converter 2, the microcomputer 7 is supplied with the coolant temperature signal THW, the intake air temperature THA, the intake air pressure signal PM, the $O_2$ sensor signal OX, etc. Via the parallel-to-serial input buffer 3, the microcomputer 7 is also supplied with the ON/OFF signal A/C from the air conditioner switch, the signal NSW from the neutral safety switch and electric loads of the defogger, head lumps and the like. Via the parallel input buffer 4, the microcomputer 7 is also supplied with the ignition fail signal IGf, the starter signal STA, the vehicle speed signal, etc.

On the other hand, the microcomputer 7 outputs the driving signal HT to the $O_2$ sensor heater, the driving signal W to the diagnosis warning lump, the driving signal to the exhausted gas recirculation (EGR) valve through the serial parallel output buffer 5. The microcomputer 7 also outputs the driving signals for the injectors, the ignition signal IGt, the driving signal for the idle speed control (ISC) valve, etc. through the parallel output buffer 6.

The microcomputer 7 fetches a crank angle signal Ne and a cylinder discriminating signal G via a waveform shaping circuit 8. The microcomputer 7 carries out various engine controls including a fuel injection control on the basis of these input signals.

The fuel injection control by the injector is performed in the following manner. The microcomputer 7 calculates a basic injection period T from the intake air pressure signal PM provided by the intake air pressure sensor and the crank angle signal Ne obtained through the waveform shaping circuit 8 through the use of a map to make various corrections on the basic injection period T. For example, the microcomputer 7 makes an increasing correction on the basic injection time T upon warm-up of the engine on the basis of a signal from the coolant temperature sensor, an increase correction after start-up of the engine on the basis of a signal from the coolant temperature sensor and an engine rotational speed represented by the Ne signal, an intake air temperature correction on the basis of a signal from the intake air temperature sensor, or an air-fuel feedback correction on the basis of the sensor signal OX. The microcomputer 7 further makes a voltage correction corresponding to a battery voltage on the corrected basic injection time T to determine a final injection time, since the response time of the injector is changed correspondingly to the battery voltage.

The fuel injection is carried out at a timing of a predetermined crank angle determined on the basis of the crank angle signal Ne and the cylinder discriminating signal G.

In this embodiment, the injector driving signals (#10, #20) and the driving signal HT for the $O_2$ sensor heater are large current output signals from 50 to 100 mA.

This embodiment with the above arrangement features that the microcomputer 7 monitors a judgement made on an output of a large current port by checking an output condition of the large current port at the time of start and end of the A/D conversion process, and makes the A/D conversion be carried out once more if there is an inversion in the output of the large current port during the A/D conversion.

Figure 2:
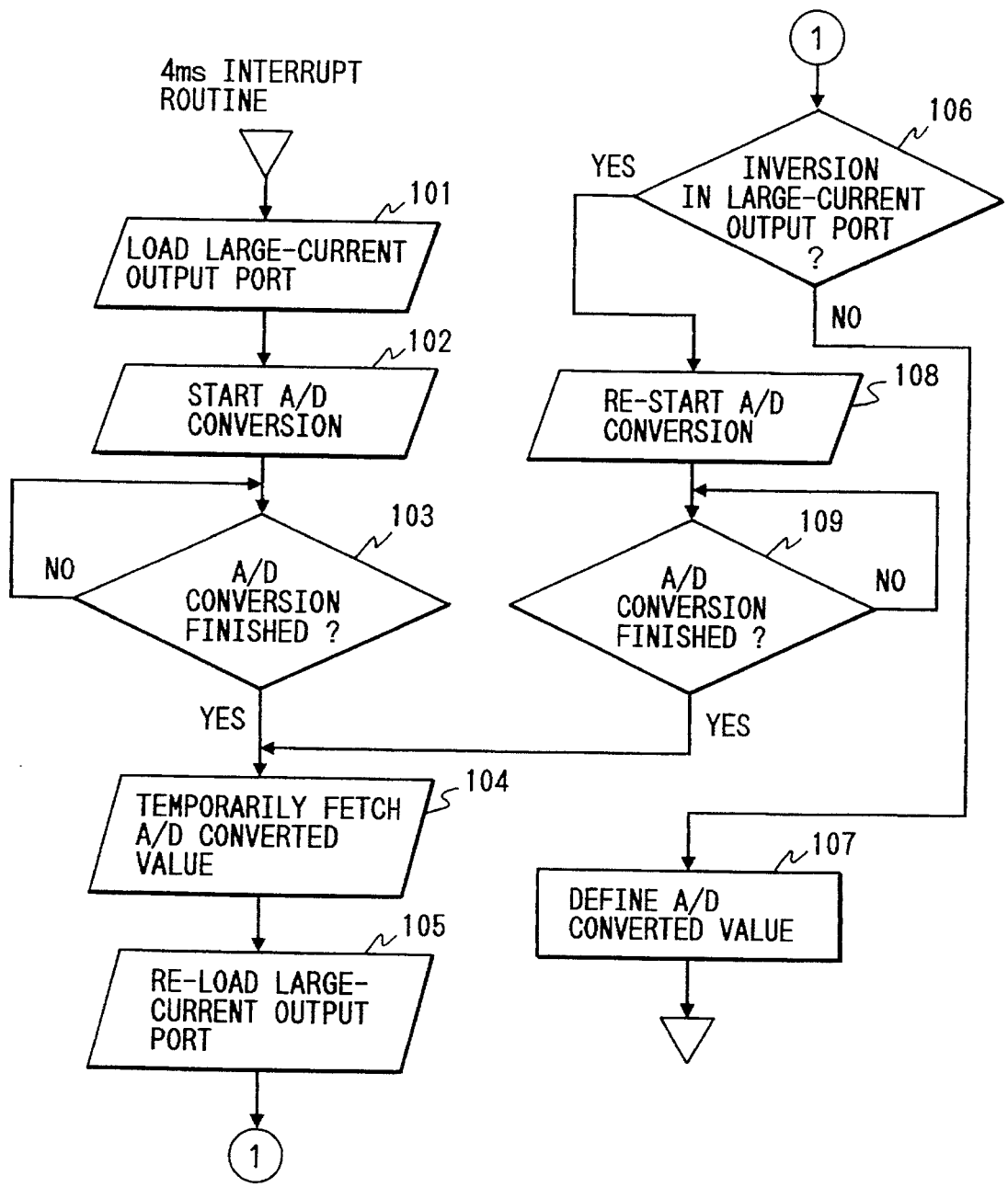
FIG. 2 is a flowchart showing an operation of the control circuit of FIG. 1 according to a first embodiment of this invention.

This operation will be hereinafter described in detail. FIG. 2 shows a flowchart carried out by the computer 7 every 4 msec. The microcomputer 7 loads a large current port in Step 101 at a time t1 shown in FIG. 3, and initiates A/D conversion in Step 102. The microcomputer 7 then awaits completion of the A/D conversion in Step 103, and temporarily fetches a resulting value of the A/D conversion in Step 104 when the A/D conversion finished at a time t2 in FIG. 3. Next, the microcomputer 7 loads the large current port once more in Step 105, and in Step 106 compares a value of the large current port loaded in Step 101 with a value after the A/D conversion was loaded in Step 105. If there is no change in the output of the large current port before and after the A/D conversion, the microcomputer 7 defines the A/D converted value temporarily fetched in Step 104 as a final A/D converted value.

Figure 3:
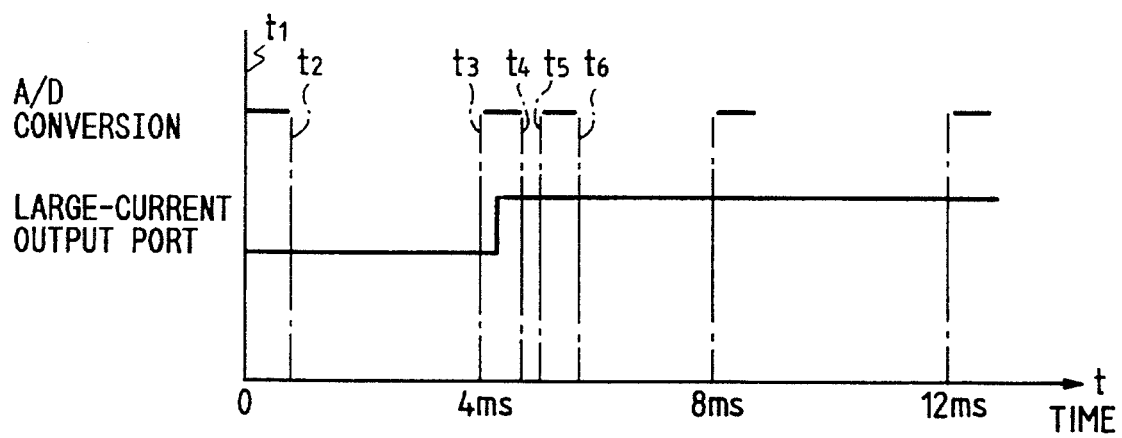
FIG. 3 is a timechart illustrating the operation of the control circuit according to the first embodiment.

On the other hand, if there is an inversion in the output of the large current port before and after the A/D conversion at a time t4 as shown in FIG. 3 in Step 106, the microcomputer 7 restarts the A/D conversion at a time t5 in FIG. 3 in Step 108. The microcomputer 7 awaits completion of the A/D conversion in Step 109, and temporarily fetches as an A/D converted value when the A/D conversion finished at a time t6 in FIG. 3 in Step 104, as set forth above. Successively, the microcomputer 7 judges as to whether there is a change in the output of the large current port during the A/D conversion in Step 106, and defines a resulting value of the A/D conversion if there is no change in the output of the large current port in Step 107.

According to this embodiment, the microcomputer identifies an inversion in the output of the large current port of the output buffer 5 or 6 in Step 106 shown in FIG. 2. If the A/D converter carries out the A/D conversion when there is an inversion in the output, the microcomputer makes the A/D converter execute the A/D conversion once more, whereby an accurate result of the A/D conversion is available without being affected by an ON/OFF change of the large current output.

Hereinafter, a second embodiment of this invention will be described chiefly in a view of its substantial differences from the first embodiment.

Figure 4:
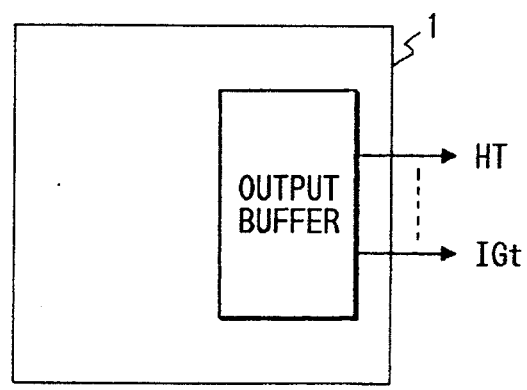
FIG. 4 is a schematic diagram of a chip included in the control circuit according to a second embodiment of this invention.

As shown in FIG. 4, the second embodiment allocates outputs, for example, the driving signal to the $O_2$ sensor heater to a highly integrated circuit, except for a large current output such as injector output for fuel injection synchronizing with the engine rotation, and the large-current high-speed output such as the idle speed control (ISC) valve driving signal. And, the output operation is carried out according to a timer routine to prevent an inversion in the output of the port during an A/D conversion.

Figure 5:
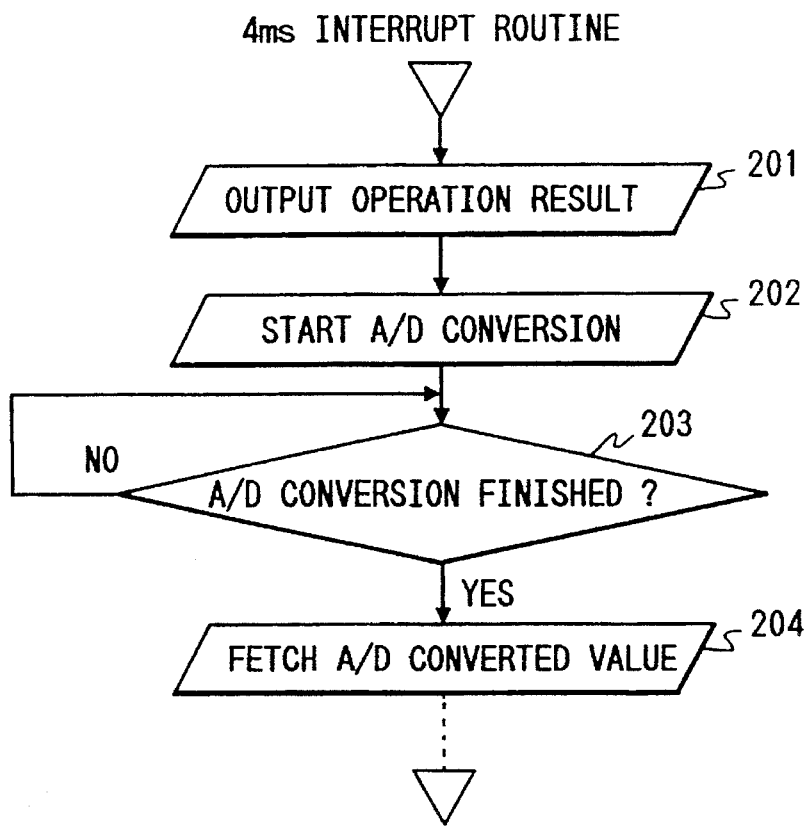
FIG. 5 is a flowchart showing an operation according to the second embodiment of FIG. 4.
Figure 6:
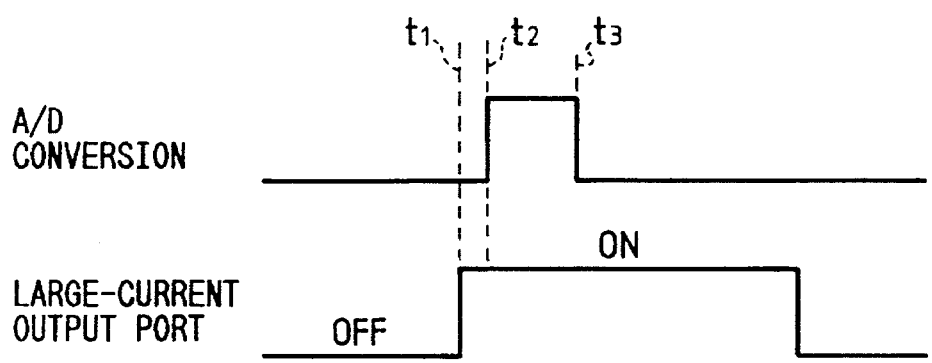
FIG. 6 is a timechart illustrating the operation according to the second embodiment.

More specifically, the microcomputer 7 carries out a process shown in FIG. 5 every 4 msec. The microcomputer 7 outputs a result of an arithmetic Operation at a time t1 shown in FIG. 6 in Step 201. The microcomputer 7, thereafter, initiates an A/D conversion at a time t2 shown in FIG. 6 in Step 202, and awaits completion of the A/D conversion in Step 203. The microcomputer 7 then fetches a resulting value of the A/D conversion at a time t3 shown in FIG. 6 in Step 204.

As seen above, this embodiment features that the time of the inversion in the output of the output buffer and the time of the A/D conversion are compulsorily staggered, whereby an accurate A/D conversion becomes possible without being affected by an ON/OFF change of the large current output.

As a modification of this second embodiment, the process in Step 201 shown in FIG. 5 may be carried out after the Step 204. In other words, it is possible to output a result of the arithmetic operation after the A/D conversion is completed.

As an example applied to this second embodiment, it is possible to calculate a period required for an A/D conversion to predict a time that the A/D conversion will finish upon start of the A/D conversion, and keep the inversion in the output waiting within a range from the start to the end of the A/D conversion.

Figure 7:
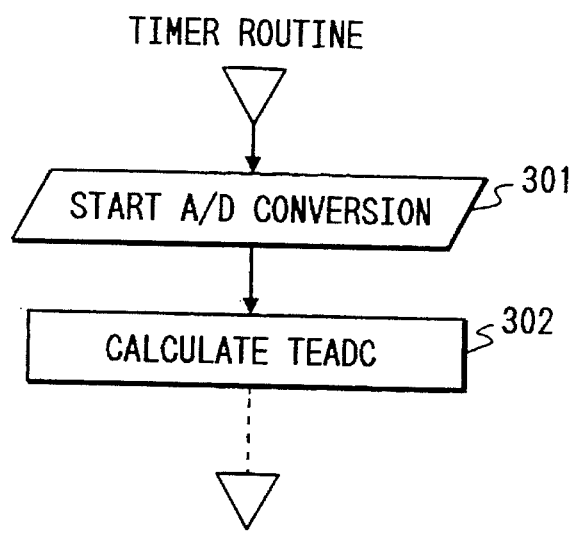
FIG. 7 is flowchart showing an operation of a modified example applied in the second embodiment.
Figure 8:
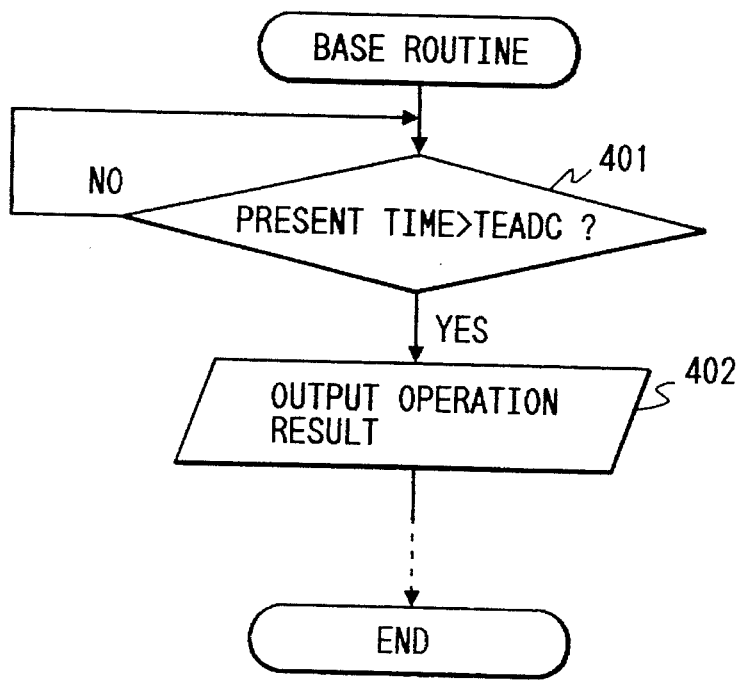
FIG. 8 is a flowchart showing the operation of a modified example applied in the second embodiment.
Figure 9:
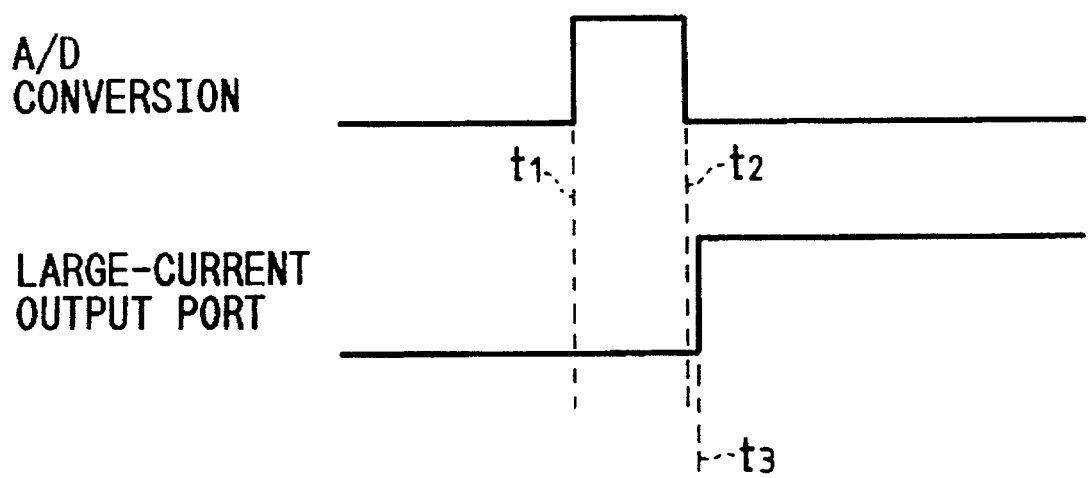
FIG. 9 is a timechart showing the operation of the modified example applied in the second embodiment.

More concretely, in a timer routine shown in FIG. 7, the microcomputer 7 initiates an A/D conversion at a time t1 shown in FIG. 9, in Step 301, and calculates a time TEADC when the A/D conversion will finish. That is, the time when the A/D conversion will finish is obtained by adding the present time with a period required for the A/D conversion, for example, 80 μsec. On the other hand, in a base routine shown in FIG. 8, the microcomputer 7 judges as to whether the current time reaches the A/D conversion finishing time TEADC in Step 401, and advances to Step 402 if the current time has reached the TEADC at a time t2 as shown in FIG. 9. The microcomputer 7 then outputs a result of the arithmetic operation at a time t3 in FIG. 9 in Step 402.

The time of an inversion in the large current output and the time of the A/D conversion are compulsorily staggered in the above manner.

Having been described the above embodiments by way of an engine control circuit, it is apparent that this invention is applicable to other control circuits.

What is claimed is:

1. An A/D conversion process in a control circuit having at least an A/D converter and an output buffer built in a chip, said process comprising the steps of:

implementing an A/D conversion;

fetching a result of the A/D conversion;

comparing a first output state of said output buffer before the A/D conversion with a second output state of said output buffer after the A/D conversion;

identifying the fetched result as an accurate result if the first output state and the second output state of said output buffer are the same.

2. An A/D conversion process according to claim 1, wherein said control circuit is an electronic control circuit for a gasoline engine of a spark ignition type having a microcomputer.

3. An A/D conversion process according to claim 1, wherein said A/D converter has input channels receiving a plurality of analog signals.

4. An A/D conversion process according to claim 3, wherein said analog signals received by the input channels of said A/D converter are at least a coolant temperature signal THW from a coolant temperature sensor detecting a temperature of a coolant for the engine, a signal HTA from an intake air temperature sensor detecting a temperature of air taken into the engine, a signal OX from an $O_2$ sensor detecting a quantity of oxygen contained in exhausted air from the engine, and a signal PM from an intake air pressure sensor detecting a pressure of air in an inlet pipe disposed downstream from a throttle valve of the engine.

5. An A/D conversion process according to claim 1, wherein said output buffer is a serial-to-parallel output buffer.

6. An A/D conversion process according to claim 5, wherein said serial-to-parallel output buffer outputs at least a driving signal HT to an $O_2$ sensor heater, a driving signal W to a diagnostic warning lamp, and a driving signal to an exhaust gas recirculation (EGR) valve.

7. An A/D conversion process according to claim 1, wherein said output buffer is a parallel output buffer.

8. An A/D conversion process according to claim 7, wherein said parallel output buffer outputs at least injector driving signals, an ignition signal IGt, and a driving signal to an idle speed control valve.

9. An A/D conversion process in an electronic control circuit for a gasoline engine of a spark ignition type having a microcomputer, said control circuit having at least an A/D converter and an output buffer built in a chip, said process comprising the steps of:

comparing an output of said output buffer immediately before an A/D conversion with an output of said output buffer immediately after the A/D conversion to discriminate a change of an output state of said output buffer; and repeating the A/D conversion after an output of a signal from said output buffer if there has been a change in the output state of said output buffer.

10. An A/D conversion process according to claim 9, wherein said A/D converter has an input channel receiving a plurality of analog signals.

11. An A/D conversion process according to claim 10, wherein said analog signals received by the input channels of said A/D converter are at least a coolant temperature signal THW from a coolant temperature sensor detecting a temperature of a coolant for the engine, a signal THA from an intake air temperature sensor detecting a temperature of air taken into the engine, a signal OX from an $O_2$ sensor detecting a quantity of oxygen contained in exhausted air from the engine, and a signal PM from an intake air pressure sensor detecting a pressure of air in an inlet pipe disposed downstream from a throttle valve of the engine.

12. An A/D conversion process according to claim 9, wherein said output buffer is a serial-to-parallel output buffer.

13. An A/D conversion process according to claim 12, wherein said serial-to-parallel output buffer outputs at least a driving signal HT to an O₂ sensor heater, a driving signal W to a diagnostic warning lamp and a driving signal to an exhaust gas recirculation (EGR) valve.

14. An A/D conversion process according to claim 9, wherein said output buffer is a parallel output buffer.

15. An A/D conversion process according to claim 14, wherein said parallel output buffer outputs at least a driving signal for an injector, an ignition signal IGt and a driving signal to an idle speed control valve.

16. An A/D conversion process according to claim 9, wherein said output buffer has an output port, a change in state of which controls a large current.

17. An A/D conversion process according to claim 16, wherein said large current is of at least one of a driving signal for an injector, a driving signal HT to an O₂ sensor, and an ignition signal IGt.

18. An A/D conversion process in an electronic control circuit for a gasoline engine of a spark ignition type having a microcomputer, said control circuit having at least an A/D converter and an output buffer built in a chip, said process comprising the steps of:

predicting a time of completion of an A/D conversion from a time the A/D conversion is started; and outputting a result of an arithmetic calculation by said microcomputer to said output buffer at the predicted time, thereby compulsorily staggering a time an output state of said output buffer is changed and a time the A/D conversion is performed.

19. An A/D conversion process according to claim 18, wherein said A/D converter has an input channel receiving a plurality of analog signals.

20. An A/D conversion process according to claim 19, wherein said analog signals received by the input channels of said A/D converter are at least a coolant temperature signal THW from a coolant temperature sensor detecting a temperature of a coolant for the engine, a signal THA from an intake air temperature sensor detecting a temperature of air taken into the engine, a signal OX from an O₂ sensor detecting a quantity of oxygen contained in exhausted air from the engine, and a signal PM from an intake air pressure sensor detecting a pressure of air in an inlet pipe disposed downstream from a throttle valve of the engine.

21. An A/D conversion process according to claim 18, wherein said output buffer is a parallel output buffer.

22. An A/D conversion process according to claim 21, wherein said parallel output buffer outputs at least a injector driving signals, an ignition signal IGt and a driving signal to an idle speed control valve.

23. An A/D conversion process according to claim 18, further comprising the step of:

initiating the A/D conversion immediately after a change in output state of said output buffer.

24. An A/D conversion process according to claim 18, further comprising the steps of:

initiating the A/D conversion immediately after a change in output state of said output buffer;

fetching a result of the A/D conversion when the A/D conversion is completed; and outputting to said output buffer a result of an arithmetic operation by said microcomputer.

25. An A/D conversion process according to claim 18, wherein said output buffer is a serial-to-parallel output buffer.

26. An A/D conversion process according to claim 25, wherein said serial-to-parallel output buffer outputs at least a driving signal HT to an O₂ sensor heater, a driving signal W to a diagnostic warning lamp and a driving signal to an exhausted gas recirculation (EGR) valve.

27. An A/D conversion process according to claim 18, wherein said output buffer has an output port, a change in state of said output port controlling a large current.

28. An A/D conversion process according to claim 27, wherein said large current is of at least one of a driving signal for an injector, a driving signal HT to an O₂ sensor, and an ignition signal IGt.

29. An A/D conversion process in an electronic control circuit for a gasoline engine of a spark ignition type having a microcomputer, said control circuit having at least an A/D converter and an output buffer built in a chip, said process comprising the steps of:

predicting a time of completion of an A/D conversion from a time the A/D conversion is started;

outputting a result of an arithmetic calculation by said microcomputer to said output buffer at the predicted time, thereby compulsorily staggering a time an output state of said output buffer is changed and a time the A/D conversion is performed; and performing the A/D conversion and causing a change in output state of said output buffer according to a timing made in regular intervals under control of said electronic control circuit.

30. An A/D conversion process in an electronic control circuit for an automobile, said control circuit having at least an A/D converter and an output buffer built in a chip, said process comprising the steps of:

comparing an output of said output buffer immediately before an A/D conversion with an output of said output buffer immediately after the A/D conversion to discriminate a change of an output state of said output buffer; and repeating the A/D conversion after an output of a signal from said output buffer if there has been a change in the output state of said output buffer.

31. An A/D conversion process in an electronic control circuit for an automobile, said control circuit having at least an A/D converter and an output buffer built in a chip, said process comprising the steps of:

predicting a time of completion of an A/D conversion from a time the A/D conversion is started; and outputting a result of an arithmetic calculation by said microcomputer to said output buffer at the predicted time, thereby compulsorily staggering a time an output state of said output buffer is changed and a time the A/D conversion is performed.

32. An A/D conversion process in an electronic control circuit for an automobile, said control circuit having at least an A/D converter and an output buffer built in a chip, said process comprising the steps of:

predicting a time of completion of an A/D conversion from a time the A/D conversion is started;

outputting a result of an arithmetic calculation by said microcomputer to said output buffer at the predicted time, thereby compulsorily staggering a time an output state of said output buffer is changed and a time the A/D conversion is performed; and performing the A/D conversion and causing a change in said output state of said output buffer according to a timing made in regular intervals under control of said electronic control circuit.

\* \* \* \* \*